United States Patent [19]
Liniger

[11] Patent Number: 5,629,845
[45] Date of Patent: May 13, 1997

[54] PARALLEL COMPUTATION OF THE RESPONSE OF A PHYSICAL SYSTEM

[76] Inventor: Werner Liniger, 703 Fieldstone Ct., Yorktown Heights, N.Y. 10598

[21] Appl. No.: 516,167

[22] Filed: Aug. 17, 1995

[51] Int. Cl.$^6$ .................................................. G06F 17/13
[52] U.S. Cl. ......................... 364/172; 364/131; 364/578
[58] Field of Search .................................. 364/131, 133, 364/148, 149, 151, 172, 174, 175, 164, 578

[56] References Cited

U.S. PATENT DOCUMENTS

| | | | |
|---|---|---|---|
| 4,918,643 | 4/1990 | Wong | 364/578 |
| 5,267,139 | 11/1993 | Johnson | 364/148 |
| 5,379,210 | 1/1995 | Grujic et al. | 364/148 |

OTHER PUBLICATIONS

K. Burrage, "Parallel Methods for Initial Value Problems", Appl. Numer. Math. 11 (1993) 5–25.
C.H. Carlin et al., "On Partioning for Waveform Relazation Time–Domain Analysis of VLSI Circuits", Proceedings Intl. Conf. on Circuits & Systems, Montreal, Quebec (1984).
G.G. Dahlquist, "A Special Stability Problem For Linear Multistep Methods", BIT 3 (1986) 27–43.
J.L.M. van Dorsselaer et al., "The ErrorCommitted by Stopping Newton Iteration in the Numerical Solution of Stiff Initial Value Problems", IMA J. Numer. Anal. 14, 2, Apr. 1994.
C.W. Gear, "The Potential of Parallelism in Ordinary Differential Equations", Tech. Rep. UIUC–DCS–R–86–1246, Comp. Sc. Dept., Univ. of Illinois at Urbana–Champaign, IL (1986).
C.W. Gear, "The Automatic Integration of Stiff Ordinary Differential Equations", Inform. Proces. 68, North Holland Publ. Co., Amsterdam (1969), pp. 187–193.
P.J. van der Houwen, "Parallel Step–by–Step Methods", Appl. Numer. Math. 11 (1993) 69–81.
F. Juang et al., "Accuracy Increase in Wavefrom Gauss–Seidel", Rep. No. 1518, Dept. of Comp. Sci., Univ. of Illinois at Urbana–Champaign, IL (1989).

E. Lelarasmee et al., "The Waveform Relaxation Method for Time Domain Analysis of Large Scale Integrated Circuits", IEEE Trans. CAD IC Syst. 1 (1982) 131–145.
W. Liniger, "A Stopping Criterion for the Newton Raphson Method in Implicit Multistep Integration Algorithms . . . ", Comm. ACM 14 (1971) 600–601.
W. Liniger, "High–Order A–Stable Averaging Algorithms for Stiff Differential Systems", Num. Methods for Differential Sys. (L. Lapidus and W.E. Schiesser, Eds.), Acad. Press. New York (1976), pp. 1–23.
J. White et al., "Waveform Relaxation: Theory and Practice", Trans. Soc. Comput. Simulation 2 (1985) 95–133.

Primary Examiner—Paul P. Gordon
Assistant Examiner—Steven R. Garland
Attorney, Agent, or Firm—Perman & Green

[57] ABSTRACT

The responses of many types of large interacting physical systems, including but not restricted to electrical, mechanical, fluidic, and biochemical systems, are describable by very large systems of ordinary differential equations, sometimes involving hundreds of thousands of equations and unknowns. Such large systems are solved rapidly by use of a distributed network of computers or a massively parallel computer. This is accomplished by a splitting technique involving the steps of: 1) subdividing the set of all differential equations on the one hand, and the set of all unknown dependent variables on the other hand, into an equal number of subsets, all but possibly one of which are of equal size; 2) splitting off part of the right side of the differential equations from the rest and replacing the unknowns in the remaining part by known input functions of time, so as to convert the original fully coupled system into a collection of uncoupled subsystems; and 3) solving each subsystem in parrallel on one of the available processors by the Backward Euler integration method. The splitting is effective only over one single integration step at a time whereas, globally in time, all of the unknowns remain coupled. This strategy results in a direct (non-iterative), accurate and stable integration scheme, requiring only two parallel solution passes over all of the subsystems per time step.

9 Claims, 11 Drawing Sheets

MODEL CIRCUIT

PARALLEL COMPUTER

COMPUTATION OF NUMBER OF BLOCKS

COMPUTATION OF INDEX VECTORS

PARALLEL UPDATING OF NUMERICAL SOLUTION

COMPUTATION OF PRELIMINARY SOLUTION $\tilde{\underline{y}}^k$

COMPUTATION OF FINAL SOLUTION $\underline{y}^k$

SOLUTION OF NONLINEAR SUBSYSTEMS BY NEWTON METHOD

SPLITTING OF COEFFICIENT MATRIX (EXAMPLE)

FIG.9

PARALLEL COMPUTATION OF THE RESPONSE OF A PHYSICAL SYSTEM

BACKGROUND OF THE INVENTION

This invention relates to a method of operation of a distributed network of computers or a parallel computer, having numerous processors, for determining the evolution of the state variables associated with the components of a large physical system, wherein this evolution is describable by a large set of ordinary differential equations, the number of which is equal to the number of state variables, and wherein these equations are subdivided into groups of equations. A vector representing all of the state variables is subdivided into subvectors or blocks, each of which is associated with one of the groups of equations and contains a specified number of vector components. Thereupon, in each group of equations, the components of the associated subvector are treated as unknown functions of time and the remainder of the state variables are lumped into a complementary vector whose components are given estimated values, preparatory to the parallel updating of the state variables with respect to time.

One type of physical system of great interest is an electrical circuit, consisting of many interconnected components such as resistors, capacitors, and inductors. By way of example, Very Large Scale Integrated (VLSI) circuits on a computer chip are representative of such systems. For a judiciously chosen combination of voltages and currents, the changes in these circuit state variables are describable via a system of Ordinary Differential Equations (ODEs). These differential equations express, by way of example, conservation of current in the various circuit nodes, and may include the relationship between currents flowing through inductors and the voltage drops across the inductors in question. In a VLSI circuit, the number of circuit components is very large, giving rise to a similarly large number of differential equations which are to be solved for the unknown voltages and currents associated with the various circuit components. In order to reduce the tremendous amount of computation time, necessitated by the solution of such large numbers of differential equations, it is imperative to solve these equations by parallel computation.

It is noted that the description of the forgoing VLSI circuit can also be used to represent, in terms of mathematically equivalent elements, the components of a mechanical system such as those of a suspension bridge. Indeed, analyses of such bridges are often conducted by way of simulation whereby mechanical structures are represented by electrical components, with currents and voltages representing velocities and forces. In this sense, the set of differential equations may represent the response of either electrical or mechanical systems. It is known from the field of fluidics that fluidic amplifiers, involving fluid flowing in channels of varying cross sections, can also be described by a system of differential equations of the Forgoing type and that such a fluid system can be simulated by electrical circuit components. In corresponding fashion, as is well known from the simulation of neural networks, a system of biochemical elements is describable by an electrical circuit and the associated set of differential equations. In this sense, differential equations describe the response of fluidic and biochemical systems as well, in a fashion analogous to that of electrical and mechanical systems.

To explain how the response of a circuit can be described by differential equations, consider the small model of an RLC circuit shown in FIG. 1. The five nodes 1–5 are connected to ground through the five capacitors $C_1$–$C_5$. Three inductors, $L_1$–$L_3$, are in series with two resistors, $R_1$, $R_2$, as shown. The directions of the current flows are indicated by arrows. If we number the five nodes by i or j, running from 1 to 5, then the following basic relationships between currents and voltages are valid:

a) A current I, flowing through a resistor of resistance R From node No. i to node No. j, satisfies Ohm's law:

$$I - G(V_i - V_j) = 0, \tag{1}$$

where $G = 1/R$ is the admittance of the resistor and $V_i$, $V_j$ denote the voltages of nodes i and j relative to ground (V=0), respectively.

b) A current I, flowing through a capacitor of capacitance C from node i to node j, satisfies $$I - Cd/dt(V_i - V_j) = 0, \tag{2}$$

where d/dt denotes the derivative with respect to time.

c) Finally, a current I, flowing across an inductor of inductance L from node i to node j, satisfies $$V_i - V_j - LdI/dt = 0. \tag{3}$$

The response of the model circuit can be described by the time dependence of the eight state variables $V_i$, where i runs from 1 to 5, $I_{L1}$, $I_{L2}$, and $I_{L3}$. The eight unknowns satisfy eight differential equations derived by using (1)–(3). The first five of these express the fact that the sum of all currents flowing out of node i minus the sum of all currents flowing into that node, i=1, ..., 5, respectively, is zero. For example, two currents flow out of node 2, namely the current $I_{R1}$ through $R_1$ into node 3 and the current $I_{C2}$ through $C_2$ to ground, and one current, $I_{L1}$, flows from node 1 through $L_1$ into node 2. Thus, $$I_{R1} + I_{C2} - I_{L1} = 0.$$

Using (1) and (2), this can be expressed as $$G_1(V_2 - V_3) + C_2 \dot{V}_2 - I_{L1} = 0,$$

where $\dot{V}_2$ is a simplified notation for the time derivative of $V_2$ and where $G_1 = C_2 = 2$.

The last three differential equations represent the so-called branch relations (3) associated with the three inductors $L_1$, $L_4$, and $L_3$, respectively. The entire system of differential equations can be written in matrix—vector form:

$$D\dot{Y} - AY = 0. \tag{4}$$

Here, Y is a vector whose components are the eight unknown state variables, D is a diagonal matrix whose diagonal elements are (1,2,3,1,1,−1,−1,−1), and the coefficient matrix $$A = \begin{pmatrix} 0 & 0 & 0 & 0 & 0 & -1 & 0 & 1 \\ 0 & -2 & 2 & 0 & 0 & 1 & 0 & 0 \\ 0 & 2 & -2 & 0 & 0 & 0 & -1 & 0 \\ 0 & 0 & 0 & -2 & 2 & 0 & 0 & 0 \\ 0 & 0 & 0 & 2 & -2 & 0 & 0 & -1 \\ -1 & 1 & 0 & 0 & 0 & 0 & 0 & 0 \\ 0 & 0 & -1 & 1 & 0 & 0 & 0 & 0 \\ 1 & 0 & 0 & 0 & -1 & 0 & 0 & 0 \end{pmatrix} \tag{5}$$

contains the information defining the interaction between the circuit state variables governing the differential equations.

The numerical values of the elements of D and A are determined from the admittances, capacitances, and inductances of the circuit of FIG. 1. The example of the current balance at node 2 considered above represents the second equation of the system (4). It should be noted that if in a circuit an inductor is replaced by a resistor, then the numbers of differential equations and unknown state variables diminish by one each.

In state-of-the-art circuit analysis and design, the systems of differential equations to be solved are very large. Furthermore, if the circuit response is to be optimized over choices of parameters (e.g. the values of R, L, and C) those systems must be solved repeatedly, once for each set of parameters.

Very often, the differential equations associated with circuits are stiff, i.e. they have both large and small time constants. Mathematically, for the model problem (4), the time constants are defined as the negative of the reciprocals of the real parts of the eigenvalues of the matrix $D^{-1}A$ of equation (4). The model problem becomes stiff if, for example, $C_5=1$ is replaced by $C_5=0.01$. Efficient numerical integration methods for stiff circuit problems are necessarily implicit, coupling all unknowns in updating the solution from one time level to the next. The updating thus requires, at each time point, the solution of very large systems of linear or nonlinear algebraic equations.

The computational task outlined above cannot be accomplished fast enough on a conventional serial computer. It is therefore imperative to make use of parallel processing on a distributed network of computers. However, designing schemes capable of exploiting parallelism at the level of the numerical integration method is difficult because the problems to be solved are intrinsically sequential in time. As a consequence, only limited progress has been made in this endeavor thus far. This is apparent in studying the Prior Art discussed hereafter.

PRIOR ART

The subject matter presented here belongs to the area of the numerical solution of ODEs. General background information on this topic and prior art relating to this invention are contained in the publications which are listed hereafter in alphabetical order and which are referenced in the text by numbers in brackets ([]). The publications are the following:

1. K. Burrage, "Parallel methods for initial value problems", Appl. Numer. Math. 11 (1993) 5–25.
2. C. H. Carlin and C. Vachoux, "On partitioning for waveform relaxation time-domain analysis of VLSI circuits", *Proceedings Intl. Conf. on Circuits & Systems*, Montreal, Quebec (1984).
3. G. G. Dahlquist, "A special stability problem for linear multi-step methods", BIT 3 (1963) 27–43.
4. J. L. M. van Dorsselaer and M. N. Spijker, "The error committed by stopping Newton iteration in the numerical solution of stiff initial value problems," IMA J. Numer. Anal. 14, 2, April 1994.
5. C. W. Gear, "The potential of parallelism in ordinary differential equations", Tech. Rep., UIUC-DCS-R-86-1246, Comp. Sc. Dept., Univ. of Illinois at Urbana-Champaign, Ill. (1986).
6. C. W. Gear, "The automatic integration of stiff ordinary differential equations", *Information Processing* 68, North Holland Publ. Co., Amsterdam (1969), pp. 187–193.
7. E. Hairer, S. P. Nørsett, and G. Wanner, *Solving Ordinary Differential Equations I: Nonstiff Problems*, Springer Verlag, Berlin, 1987.
8. E. Hairer and G. Wanner, *Solving Ordinary Differential Equations II: Stiff & Differential—Algebraic Problems*, Springer Verlag, Berlin, 1991.
9. P. J. van der Houwen, "Parallel step-by-step methods", Appl. Numer. Math. 11 (1993) 69–81.
10. F. Juang and C. W. Gear, "Accuracy increase in waveform Gauss-Seidel", Rep. No. 1518, Dept. of Comp. Sci., Univ. of Illinois at Urbana-Champaign, Ill. (1989). large scale integrated circuits", IEEE Trans. CAD IC Syst. 1 (1982) 131–145.
12. W. Liniger, "A stopping criterion for the Newton-Raphson method in implicit multistep integration algorithms for nonlinear systems of ordinary differential equations", Comm. ACM 14 (1971) 600–601.
13. W. Liniger, "High-order A-stable averaging algorithms for stiff differential systems", *Numerical Methods for Differential Systems* (L. Lapidus and W. E. Schiesser, Eds.), Academic Press, New York (1976), pp.1–23.
14. R. Varga, "Matrix Iterative Analysis", Prentice-Hall, Inc., 1962.
15. J. White et al., "Waveform relaxation: theory and practice", Trans. Soc. Comput. Simulation 2 (1985) 95–133.

The books by Hairer, Norsett, and Wanner [7,8] are excellent modern sources of general information on the numerical solution of ODEs. Because of its practical importance, much research work is currently being devoted to the parallel solution of ODEs. This work was surveyed recently by Burrage [1] and , van der Houwen [9]. Two different avenues for exploiting parallelism in solving ODEs were distinguished by Gear [5]:

1) Parallelism across time or across the integration method, and

2) Parallelism across the system of equations (space).

Numerical techniques of the first type seem to be capable only of a strictly limited amount of parallelism. In other words, they can make use of only a small specific number of processors [1]. The gain in speed achieved by such methods is insufficient for solving very large problems such as those outlined above. Techniques capable of exploiting massive parallelism are needed to accomplish this task. Some of the methods exploiting parallelism across the system of equations do have this capability. Another requirement for a parallel technique to be useful for many practical applications is that it be efficient for solving stiff problems.

The parallel approaches for solving systems of differential equations can also be divided into direct and iterative schemes. Iterative schemes are easier to design than direct ones. They can be shown to converge for certain restricted classes of problems [14] but they can also fail, either because they diverge or because they converge too slowly. Even if an iterative scheme converges, it is in general difficult to know the rate of convergence and thus to determine after how many correction steps the iteration should be stopped. The speed of convergence of an iterative scheme also depends on the nature of the problem to be solved and on the ordering of equations and unknowns.

Direct methods are harder to propose, especially for stiff problems. This is evidenced by the Fact that, among the parallel techniques proposed thus far for solving large stiff systems of ODEs, the techniques capable of exploiting massive parallelism across the system are all iterative in nature. It is, in fact, believed [1,p.15] that integration techniques capable of exploiting massive parallelism are necessarily of iterative type.

An important existing iterative approach for exploiting massive parallelism in the time domain analysis of large-scale circuits is the Waveform Relaxation (WR) method [11,15]. Problems of circuit analysis can, on physical grounds, often be divided into tightly coupled subsystems with loose coupling between the subsystems. Furthermore, because of the highly directional nature of the current flow in transistors, circuit problems can often be brought into nearly triangular matrix form by proper ordering of equations and unknowns. The WR method splits the Full problem into a number of smaller problems, corresponding to the subsystems, and integrates each subsystem independently over the Full interval of integration, or large portions thereof referred to as "windows". In doing this, it treats the coupling terms to the other subsystems as given input functions. It then uses a Jacobi or Gauss-Seidel iteration until the approximations converge to the solution of the system as a whole. From the viewpoint of parallelism, the most natural iteration scheme is the Jacobi method. But the faster converging Gauss-Seidel scheme can also be applied when the coupling between subsystems is unidirectional as in the case of transistors.

For the structured circuit problems mentioned above, the WR method is very efficient. However, if the subsystems are strongly coupled or if the grouping of unknowns into subsets is not obvious, the WR method may converge too slowly [2,10]. As a consequence, the implementation of any of the foregoing procedures for the parallel computation of the state variables of a large physical system can be accomplished only by an excessively large number of computation steps, wherein the resulting excessively long computation times detract greatly from the usefulness of a parallel computer as a viable means for determining the evolution of the state variables.

SUMMARY OF THE INVENTION

The foregoing problems are overcome and other advantages are attained by the present invention which provides a method of operating a distributed network of computers or a parallel computer with an arbitrary number of processors For determining the responses of large physical systems, such responses being describable by large systems of ordinary differential equations. Examples of such systems are very large scale integrated circuits, mechanical systems such as suspension bridges, fluidic amplifiers, and biochemical elements in neural networks. The method provided by this invention is a direct technique, capable of exploiting massive, parallelism and applicable to very large sift systems.

With respect to material which is to be processed mathematically, the invention proceeds by arranging the material in various sections, prior to the mathematical processing, wherein each section is to be processed by one of numerous processors of a distributed or parallel computer system. The arrangement of the material in the various sections provides tasks for the respective processors, which tasks can be accomplished efficiently in a time-saving manner. Furthermore, the results of the tasks are usable readily in a subsequent iteration of the mathematical processing at each processor to rapidly obtain the values of state variables of a physical system. By way of example, state variables include current in a component of an electrical system, speed in a mechanical system, fluid flow rate in a fluidic system, and neurophysiological signal strength in case of a component of a biological system. More specifically, the utility of the invention is Found in a dramatic quickening of the computation time of the system of processors in a solving of numerous differential equations through integration.

The differential equations describing a physical system are to be integrated over an interval of time, divided into a sequence of integration steps. The integration is carried out sequentially over successive time steps. This invention of a parallelizable integration scheme sets forth the manner in which the solution is updated within each of these integration steps.

The system of differential equations consists of an arbitrary number of equations and an equal number of unknowns. The set of all equations and the set of all unknowns are divided into an equal number of subsets or blocks and each subset of equations and corresponding block of unknowns is to be processed by one of the available processors. To balance the load on the processors, all but possibly one of the blocks of unknowns are chosen to be of equal size. The number of blocks is equal to or smaller than the number of available processors.

From the right hand side of each subset of equations a portion, referred to as the splitting function, is split off. This portion depends only on the corresponding block of unknowns. For example, the splitting function of the third subset of equations only depends on the third block of unknowns, and similarly for all the others. For each subset of equations, the unknowns in the remaining complementary part of the right hand side are replaced in an appropriate way by known input functions of time.

As a result of the foregoing, the subsystems of equations become uncoupled from one another as far as the determination of the unknowns is concerned and each of them can be integrated on one of the available processors in parallel with, and independently of, all the others. The subsystems are solved numerically by applying to them the familiar Backward Euler (BE) integration method.

After completion of one updating step for all the subsystems, the information from the various processors is collected at some memory location in the parallel computer and then rebroadcast to all the processors. This course of events is referred to as a solution pass over all the subsystems.

The splitting defined above is effective only over one integration step at a time. Globally in time, all unknowns remain coupled. Because of this strategy, the parallel integration scheme described in this invention is of direct (non-iterative) type, requiring only two solution passes over the uncoupled subsystems per time step; it may thus be referred to as the Direct Splitting (DS) method. Unlike iterative methods, the DS method terminates after an a priori specifiable number of computation steps which is important for real-time applications.

The result of applying the BE method to the decoupled system of differential equations is of the same order of accuracy as that of applying the BE method to the fully coupled system of equations, and the parallel integration scheme is numerically stable for all problems with a certain amount of dissipation.

The procedure of the invention can be generalized. For example, the DS method can be implemented with a more accurate numerical integration scheme than the BE method, and the particular splitting function proposed in this invention can be replaced by a more general one, thereby enhancing the numerical stability of the parallel integration scheme.

BRIEF DESCRIPTION OF THE DRAWING

The presentation of the Direct Splitting method given herein makes reference to the accompanying drawing, wherein:

FIG. 9 illustrates the matrix and vector block structures for a small example of a linear banded system of differential equations.

DETAILED DESCRIPTION

Figure 1:
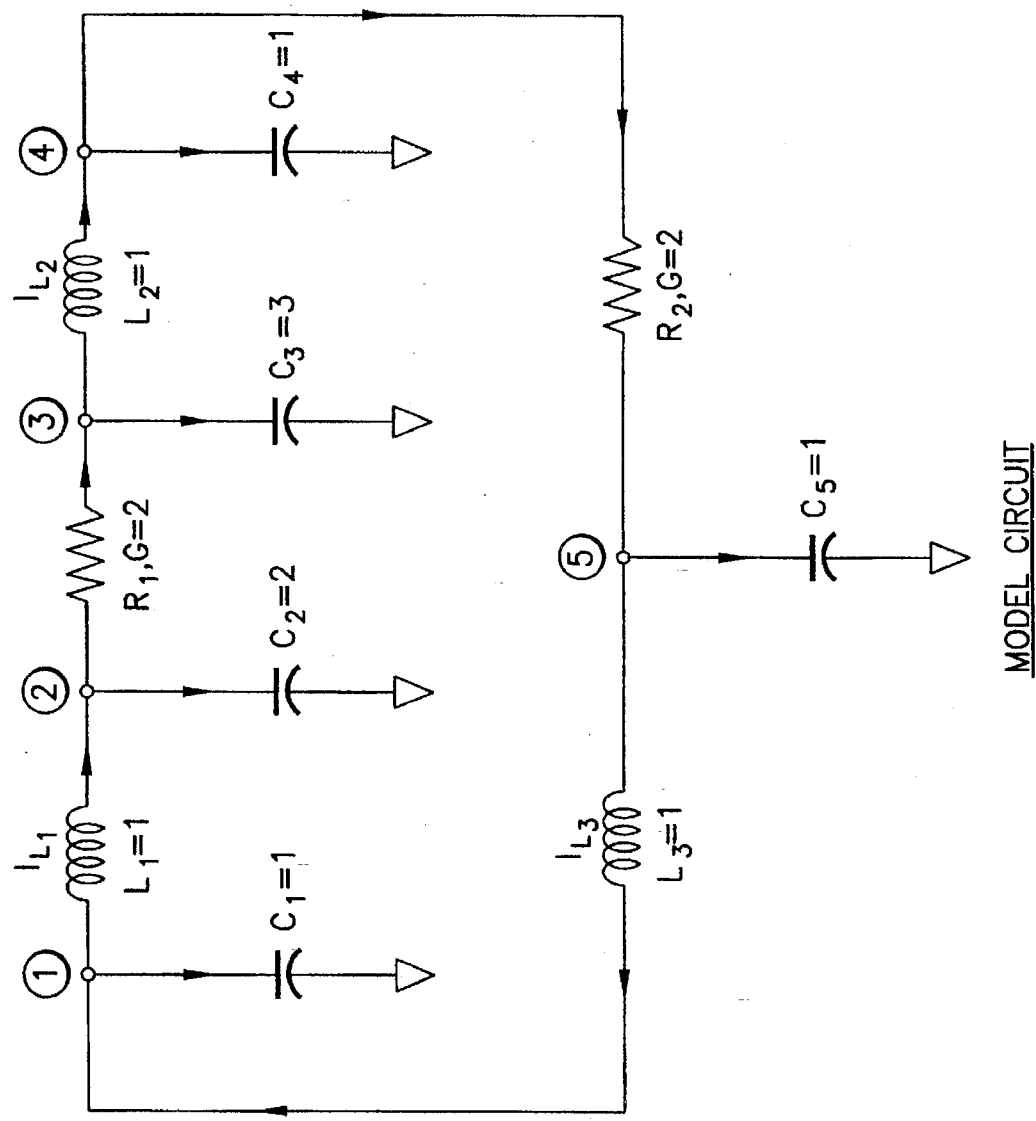
FIG. 1 shows a diagram of a simple example of an electrical circuit, used to explain how the response of such a circuit is describable by differential equations.

The Direct Splitting (DS) method proposed in this invention is a direct (non-iterative) scheme for the fast computation of the time domain response of large stiff systems of ordinary differential equations on a massively distributed computer system. As a direct method, its performance is independent of the factors controlling the rate of convergence of existing iterative techniques, some of which are discussed in the Prior Art section above. The validity of the DS method has been established both by rigorous mathematical analysis and by numerical test calculations.

The DS technique is combined with a conventional numerical integration method for ODEs. For simplicity, it is presented in terms of the A-stable [3] Backward Euler (BE) method, also referred to as the backward differentiation method [6] of first order. This particular version of the DS method will be identified by the symbol DSBE. But the DS technique can be implemented, in a similar way, with other more elaborate integration schemes of higher orders of accuracy. Higher order results can also be achieved, for example, by combining low order schemes with Richardson extrapolation methods [3] or with the method of averaging [13].

The differential equations are integrated over an interval of the independent variable, referred to here as time t, starting from given initial values at t=0. The time interval is subdivided into a finite number of time steps of either constant or variable duration and the solution is computed sequentially time step by time step. The novel aspects of the parallel integration scheme claimed in the invention lie in the manner in which the numerical solution is updated within each time step, i.e. in stepping from any one time level to the next.

In general, the response of electrical circuits is described by nonlinear systems of differential/algebraic equations of the form $$F(t,\dot{Y},Y,Z)=0,$$
$$G(t,Y,Z)=0. \qquad (6)$$

Here the first row of (6) represents the differential equations, the number of which is equal to the number of state variables forming the vector Y, and the second row of (6) states the algebraic constraints, the number of which equals the number of constraint variables forming the vector Z. The DS technique is applicable to systems of the form (6) but, for the sake of simplicity, the invention is explained here for the quasilinear counterpart of the ODE problem (4), i.e.

$$D\dot{Y}=F(t,Y). \qquad (7)$$

Here, m is the order of the system (7), i.e. Y and F are vectors of length m, and D is a square block-diagonal matrix. The vectors Y and F are split into K blocks (subvectors) $Y^k$ and $F^k$, k=1, . . . , K, of length $\leq$b, 1$\leq$b$\leq$m, and the diagonal blocks of D are square of corresponding dimension. In order to balance the load on the processors, which will be operating in parallel on the various blocks of data, it is advantageous to let the subvectors $Y^k$ and $F^k$, k=1, . . . , K−1, all be of equal length b; $Y^K$ and $F^K$ are also of length b or shorter, depending on whether m is or is or is not divisible by b, respectively. Hence K=m/b if m is divisible by b, or K=1+[m/b] if m is not divisible by b; here [m/b] denotes the integer part of the quotient m/b.

In block form, the equation (7) becomes $$D_k^k \dot{Y}^k = F^k(t,Y) = F^k(t,Y^1, \ldots, Y^k, \ldots, Y^K), \qquad (8)$$

for k=1, . . . , K, where $D_k^k$ is the $k^{th}$ diagonal block of D.

In order to introduce the idea of the splitting method, we rewrite (8) in the equivalent form $$D_k^k \dot{Y}^k - f^k(t,Y^k) = F^k(t,Y) - f^k(t,Y^k), \qquad (9)$$

for k=1, . . . , K, where we have subtracted from both sides of the equation (8) some suitably chosen function $f^k$, referred to hereafter as the splitting function. Note that, unlike $F^k$ which may depend on the full vector of unknowns Y, the splitting function $f^k$ depends only on the subvector $Y^k$. We now rename the right hand side of (9) as $$g^k(t,Y) = F^k(t,Y) - f^k(t,Y^k) \qquad (10)$$

and rewrite (9) in the form $$D_k^k \dot{Y}^k - f^k(t,Y^k) = g^k(t,Y). \qquad (11)$$

Next we replace, in a suitable manner as defined hereafter, the unknown vector Y among the arguments of $g^k$ on the right side of (11) by a vector which, within the context of updating the solution over each individual time integration step, represents a known input function of time, denoted by $\hat{Y}=\hat{Y}(t)$. The resulting relation $$D_k^k \dot{Y}^k - f^k(t,Y^k) = g^k(t,\hat{Y}), \qquad (12)$$

for k=1, . . . , K, is a replacement of (8) in which, for each k, the only remaining unknown dependent variables (on the left side) are the components of $Y^k$. Therefore, the K subsystems of (12) are now decoupled from one another as far as the unknowns are concerned and each of them can be integrated, in parallel with all the others, on respective ones of the available processors by a conventional numerical integration method such as the BE method.

One simple definition of the splitting function is to let $$f^k(t,Y^k) = F^k(t,0,\ldots,0,Y^k,0,\ldots,0). \qquad (13)$$

In the linear case, $$f(t,Y) = A \cdot Y + u, \qquad (14)$$

where in general A and u depend on t, and the splitting can be written in the form $$A = B + C. \quad (15)$$

The subdivision of the vector Y into subvectors $Y_k$, $k=1, \ldots, K$, induces a subdivision of the matrix A into submatrices or blocks $A_q^k$, $k,q=1, \ldots, K$, of dimensions corresponding to those of the subvectors, and similarly for B and C; here, the superscript and subscript of A represent block row and column numbers, respectively. More specifically, B is a block-diagonal matrix with square diagonal blocks $B_k^k$ and $C=A-B$. The special splitting (13) then simply means that the block diagonal part of B is equal to the block diagonal part of A, and the block diagonal part of C is zero. Other splittings can be performed, if desired, and such splittings may be more advantageous, from the point of view of the numerical stability of the parallel integration scheme, than the splitting defined by (13).

The BE method applied to (12) with an integration step h becomes $$D_k^k y^k - h g^k(t, y^k) = r^k, \quad (16)$$

where, by definition, $$r^k = D_k^k y^{k-} + h g^k(t, \hat{y}), k=1, \ldots, K, \quad (17)$$

and where $y^k$, $\hat{y}$, $y^{k-}$ and are numerical approximations of $Y^k(t)$, $Y(t)$, and $Y^k(t-h)$, respectively.

The key ideas behind the DS method are the following:

a) To be able to solve for the unknowns $y^k$, $k=1, \ldots, K$, in parallel, the $y^k$ need to be uncoupled from the variables in the second argument $\hat{y}$ of $g^k$ only during the current time step; globally in time, all unknowns remain coupled.

b) The substitution of the known input data $\hat{y}$ for the unknown y can be done in such a way as to introduce an error so small that, after only one or two passes over the subsystems in (16), the solution $y=(y^1, y^2, \ldots, y^k)$ of (16) represents a first order accurate approximation of the exact solution Y(t) of (7) over the entire interval of integration, as does the solution of the Fully coupled system (7) computed by the BE method. A basis For this substitution was developed earlier in a different context, namely in evaluating the stopping error after a finite number of Newton steps in solving nonlinear ODEs by implicit integration methods [12], and was further analyzed in [4].

c) Step b) can be realized by letting $\hat{Y}=y^-$, where $y^-$ is a numerical approximation of Y(t-h), producing a preliminary result $\tilde{y}^k$, $k=1, \ldots, K$, and by using $\hat{y}=\tilde{Y}$ in the second pass and accepting the result of that second pass as the final answer $y^k$, $k=1, \ldots, K$.

The most important benefits of the Direct Splitting (DS) method proposed in this invention for the parallel computation of the time domain response of the state variables of a large physical system of interconnected components and its advantages over related work are the following:

1. The DS method is a massively parallel approach for solving very large stiff systems of ordinary differential equations describing the time domain response of physical systems such as VLSI circuits.

2. On a distributed network with an arbitrarily large number p of processors, the DS method can make use, in a load-balanced fashion, of $K \leq p$ processors by splitting the unknowns into K blocks, all but one or which are one size b, and one is of size smaller than or equal to b, where b is a suitably chosen parameter.

3. The DS method is a direct scheme and as such is not affected by convergence difficulties from which iterative methods, such as the WR method and parallel predictor-corrector schemes, may suffer. The DS method is, to the inventor's knowledge, the only direct scheme for computing the time-domain response of stiff systems of differential equations available at the present time which is capable of exploiting massive parallelism across the system.

4. Because it is a direct scheme, the DS method terminates after an a priori known number of computation steps. This is particularly important for real-time applications.

5. As a direct scheme the performance of the DS method is, unlike that of iterative methods, largely independent of the nature of the underlying problem and the grouping of the unknowns. It is thus a general purpose parallel solver for stiff systems of differential equations.

6. The response computed by the DS method is of the same order of accuracy as that produced by the underlying, fully implicit integration method. For example, DSBE (the DS method used in conjunction with the BE integration scheme) is first order accurate as is the BE method itself.

7. The DSBE method is numerically stable for arbitrarily large integration steps when applied to stiff problems with a certain amount of dissipation.

8. The performance of the DS method may be further enhanced by making use of such familiar tools of numerical mathematics as sparse matrix methods, extrapolation methods, modified Newton schemes, stopping the Newton method after a finite number of steps, variable integration steps, etc., as well as by exploiting parallelism at the algebraic level, e.g. by simultaneous evaluation of matrix elements or components of vector-valued functions.

The DS method can be modified and generalized in various ways. Some of the possible modifications are the following:

1. The split system can be discretized by an integration scheme other than the BE method. The number of passes over the subsystems, required for the DS method to be as accurate in order as the integration of the fully coupled system, depends in general midly on the choice of the integrator.

2. The special choice (13) of the splitting function can be generalized in ways which make the DS method stable for problems with lesser amounts of dissipation.

3. The number of time steps over which the subsystems are integrated before redefining the input function $\hat{y}$ in (17), called the splitting interval, may be some reasonably small integer larger than 1. Choosing a splitting interval larger than one integration step reduces the frequency at which the processors have to communicate with one another. It does not invalidate the conclusion that the DS method, after a certain number of passes over the subsystems (maybe slightly larger than 2), is as accurate in order as the underlying integrator.

IMPLEMENTATION OF THE INVENTION

The following procedural steps facilitate an understanding of the practice of the invention.

Overall Procedure

1. Produce a numerical solution $y_j = Y(t_j)$ for $0 \leq t_j \leq T, j=0,1, \ldots, n$, with suitably chosen variable integration steps $h_j = t_j - t_{j-1}, j=1, \ldots, n$, where $[0,T]$ is the interval of integration. Compute the solution sequentially with respect to j for $j=1, \ldots, n$, starting from $y_0 = Y(0)$.

2. For each j, calculate $y = y_j$ by parallel solution of the K uncoupled subsystems defined by (16) and (17) and form $y = y_j = (y_j^1, \ldots, y_j^K)$. In the calculation of $r^k$ by (17), use $y^k = y_{j-1}^k$, and one of the two given input vectors $\hat{y} = \hat{y}_j$ defined in item 3 hereafter.

3. For each j, solve (16) in two passes over all k, k=1, ..., K. In the first pass, let $\tilde{y}_j = y_{j-1}$, and produce a preliminary solution $\tilde{y}_j = (\tilde{y}_j^1, \ldots, \tilde{y}_j^K)$ of (16). In the second pass, let $\tilde{y}_j = \tilde{y}_j$ and solve (16) for the definitive result $y_j = (y_j^1, \ldots, y_j^K)$.

4. If $f^k$ in (12) is nonlinear, solve the algebraic subsystems for each k by Newton's method, i.e. by iterating the procedure defined in item 5 hereafter an appropriate number of times.

5. Given a guess z for $y^k$, solve the linear system $$(D_k^k - hJ^k)\delta z = -R^k, \tag{18}$$

$$R^k = D_k^k z - hf^k(t,z) - r^k, \tag{19}$$

for the Newton correction or $\delta z$, and update the guess z for $y^k$ by $z^+ = z + \delta z$. Here $J^k = \partial f^k/\partial Y^k(t,z)$ is the Jacobian matrix and $r^k$ is defined by (17).

Solution Updating for Linear Problems

1. For a linear problem (or one which has been linearized by Newton's method), F(t,Y) is of the form (14), and (11) can be written in matrix-vector form:

$$D\dot{Y} = BY + CY + u, \tag{20}$$

where B and D are block diagonal matrices with square diagonal blocks $B_k^k$ and $D_k^k$, k=1, ..., K, respectively, and C=A-B.

2. The subvectors $Y^k$ are defined by $Y(i^k)$, where $i^k$ is the vector of indices of the components of Y belonging to $Y^k$. The submatrices $A_q^k$ of A, k, q=1, ..., K, are defined by $A(i^k, i^q)$, where the first and second arguments represent block row and column indices, respectively; similarly for C. The diagonal blocks $B_k^k$ of B are $B(i^k, i^k)$, and similarly for D.

3. The matrix-vector product of the $k^{th}$ row $C^k$ of C, formed by row-wise composition of the blocks $C_q^k$ for q=1, ..., K, times the vector Y, $$C^k \underline{Y} = \sum_{q=1}^{K} C_q^k \underline{Y}^q, \tag{21}$$

can be formed as shown in item 4, namely:

4. Compute $C^k Y = P^k Y_P^k + C_k^k Y^k + Q^k Y_Q^k$, where the "left block" matrix $P^k$ is a rectangular matrix of b rows, consisting of all or part of the subdiagonal blocks $C_1^k$, $C_2^k$, $C_{k-1}^k$. Similarly, the "right block" matrix $Q^k$ consists of all or part of the superdiagonal blocks $C_{k+1}^k, \ldots, C_K^k$. The matrices $P^k$, $C_k^k$, and $Q^k$ and the vectors $Y_P^k$ and $Y_Q^k$ are computed as shown in item 5, namely:

5. Let $i_P^k$ identify all those components of the blocks $Y^q$, q<k, which in the $k^{th}$ block row $C^k$ of C are coupled to (at least one component of) $Y^k$. Then $P^k = C(i^k, i_P^k)$ and $Y_P^k = Y(i_P^k)$. Similarly $Q^k = C(i^k, i_Q^k)$ and $Y_Q^k = Y(i_Q^k)$, where $i_Q^k$ denotes the components of the blocks $Y^q$, q>k, which in $C^k$ are coupled to $Y^k$. In accordance with the definition in item 2, let $C_k^k = C(i^k, i^k)$. Finally, if $I^k = (i_P^k, i^k, i_Q^k)$, then $C^k Y = C(i^k, I^k) Y(I^k)$.

6. The implementation of DSBE discussed here (in particular the flow chart of FIG. 4) takes into account the possibility that the system (7) may be banded. In the linear case, this means that the coefficient matrix A of (14) has, on either side of the center diagonal, s diagonals whose elements are not all equal to zero. Here, s is a given non-negative integer parameter smaller than or equal to m−2. As a consequence, the total bandwidth of the matrix is 2s+1. The system is "full" if s=m−1. For a banded system, the components $F^i$, i=1, ..., m, of the vector function F of equation (7) satisfy $$F^i = F^i(t, Y^{i-s}, \ldots, Y^i, \ldots, Y^{i+s}). \tag{22}$$

Superscripts in (22) falling outside of the interval [1,m] are to be ignored.

Description of Operation

A diagram of a simple RLC circuit is shown in FIG. 1 as has been explained herein above. This diagram is useful for explaining the derivation of the differential equations, governing the response of the circuit. From basic laws of circuit analysis.

Figure 1A:
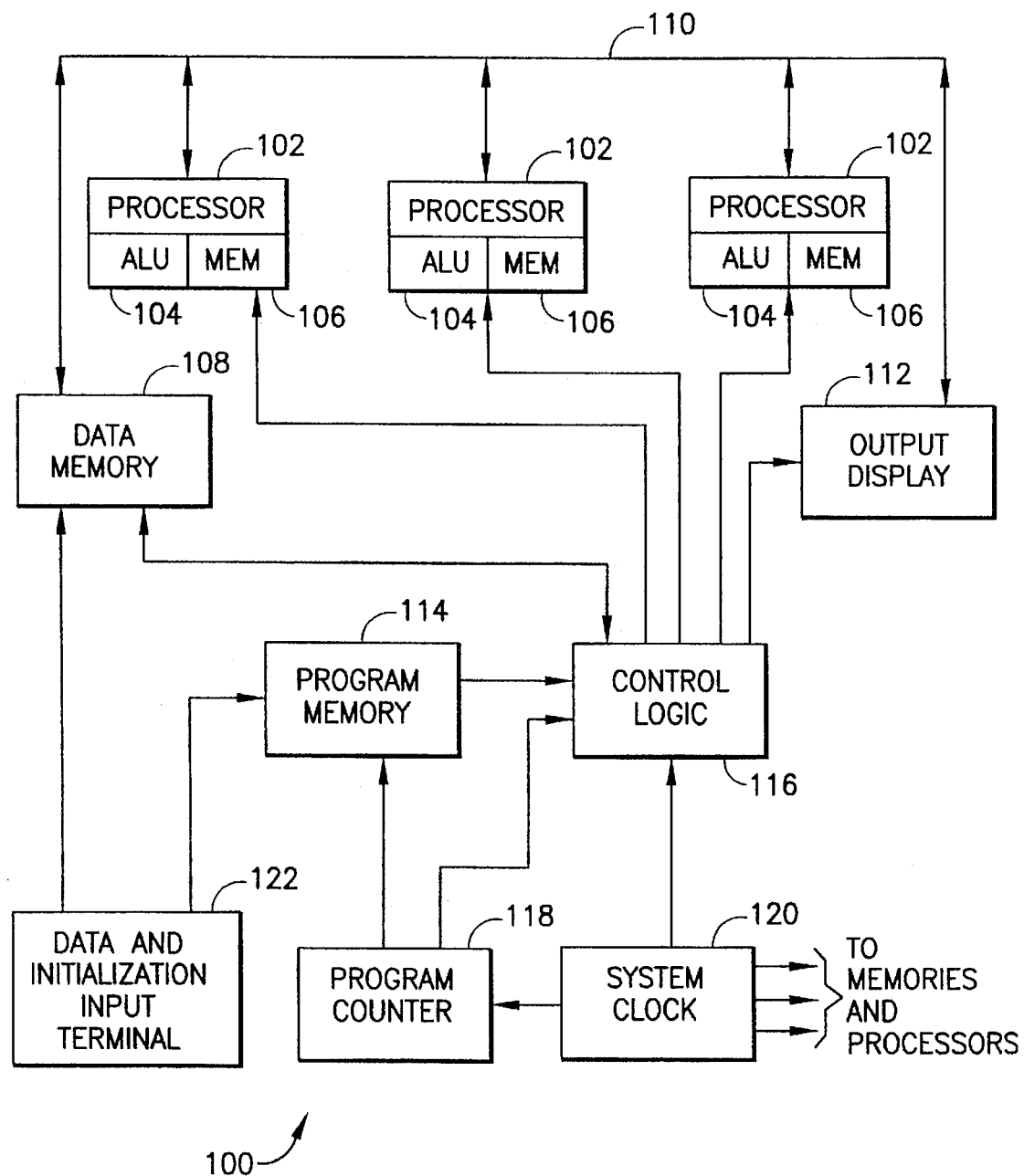
FIG. 1A shows a simplified block diagram of a parallel computer with multiple processors.

A simplified block diagram of a parallel computer is shown in FIG. 1A. Such a computer might be used to solve the differential equations describing the response of a physical system via the method claimed in this invention. In the description of this diagram given hereafter, numbers refer to the components of the diagram.

The parallel computer 100 shown in FIG. 1A comprises a multiplicity of processors 102, three of which are shown by way of example, each of the processors having an Arithmetic Logic Unit (ALU) 104 and a memory 106. In each of the processors 102, the ALU performs arithmetic operations on numerical quantities in the memory 106, the arithmetic operations providing for the solution of the differential equations. A data memory 108 connects via a bus 110 with each of the processors 102, the bus enabling communication of data among the processors 102, and between individual ones of the processors and the data memory 108. Information to be outputted by the computer 100 is presented on a display 112 which connects with the bus 110 for communication of data between the display 112, the processors 102, and the memories 106.

Also included in the parallel computer 100 shown in FIG. 1A are a program memory 114, a control logic unit 116, a program counter 118, and a system clock 120. The clock provides clock signals to the logic unit 116, to the data memory 108 and the program memory 114, and to the processors 102. In particular, the counter 118 counts the clock pulses of the clock 120 for outputting an address to the program memory 114. The program memory 114, in response to addressing by the counter 118, outputs program steps to the logic unit 116 which, in turn, provides commands to the data memory 108, the processors 102, and the display 112. CormTrends of the logic unit 116 implement selection of specific ones of the processors 102 for various subvectors, of the vector of all of the state variables of the physical system, stored in the data memory 108, and the information stored in the data memory may be employed by the logic unit 116 in implementing its logic functions. An input terminal 122 enables personnel operating the computer 100 to input data and initial conditions into the data memory 108 and into the program memory 114 for solving the differential equations.

Figure 4:
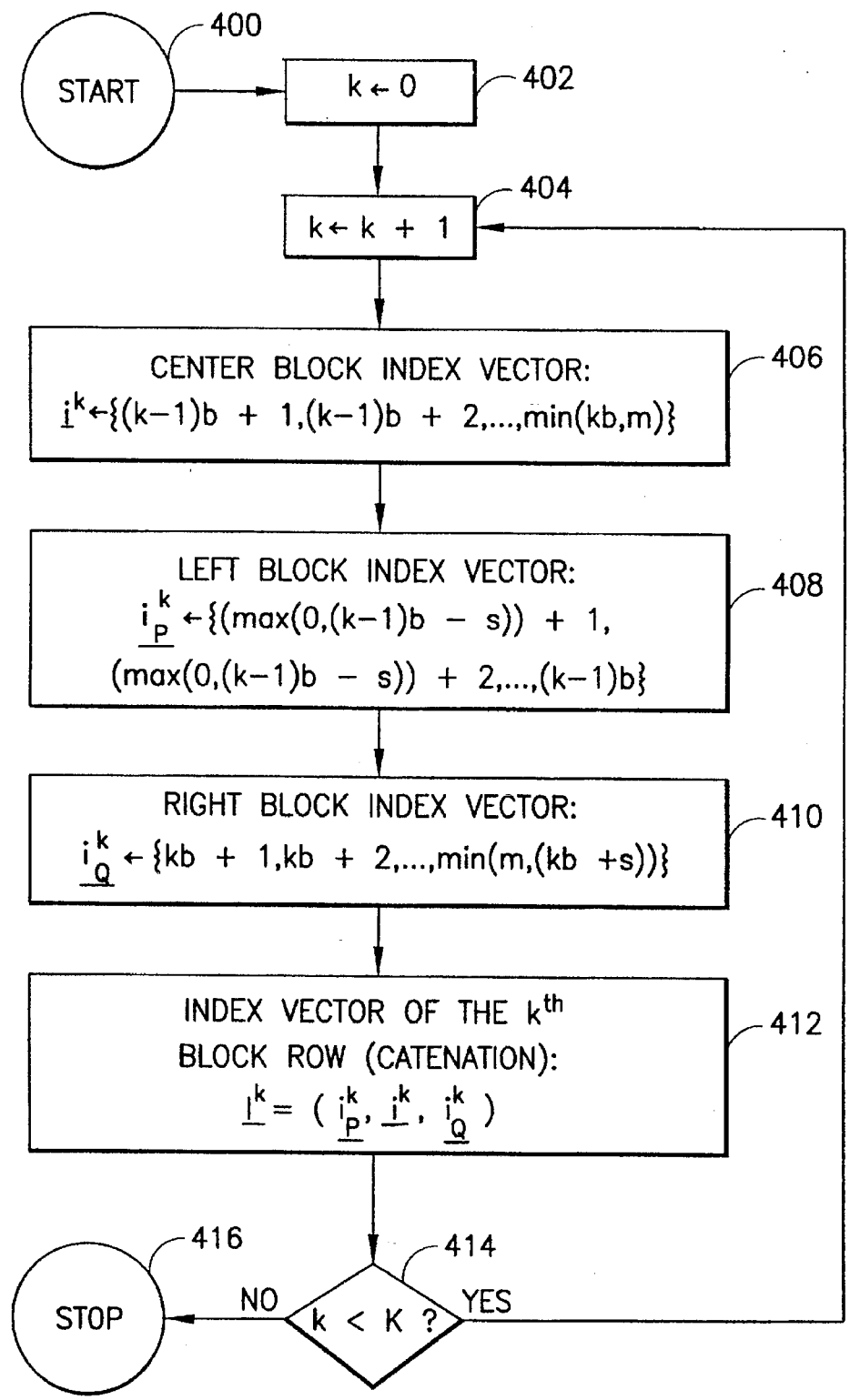
FIG. 4 contains the rules for computing the dimensions of the leg, center, and right blocks of the $k^{th}$ block row of a banded, block-tridiagonal linear system of equations, where k=1, . . . , K.
Figure 5:
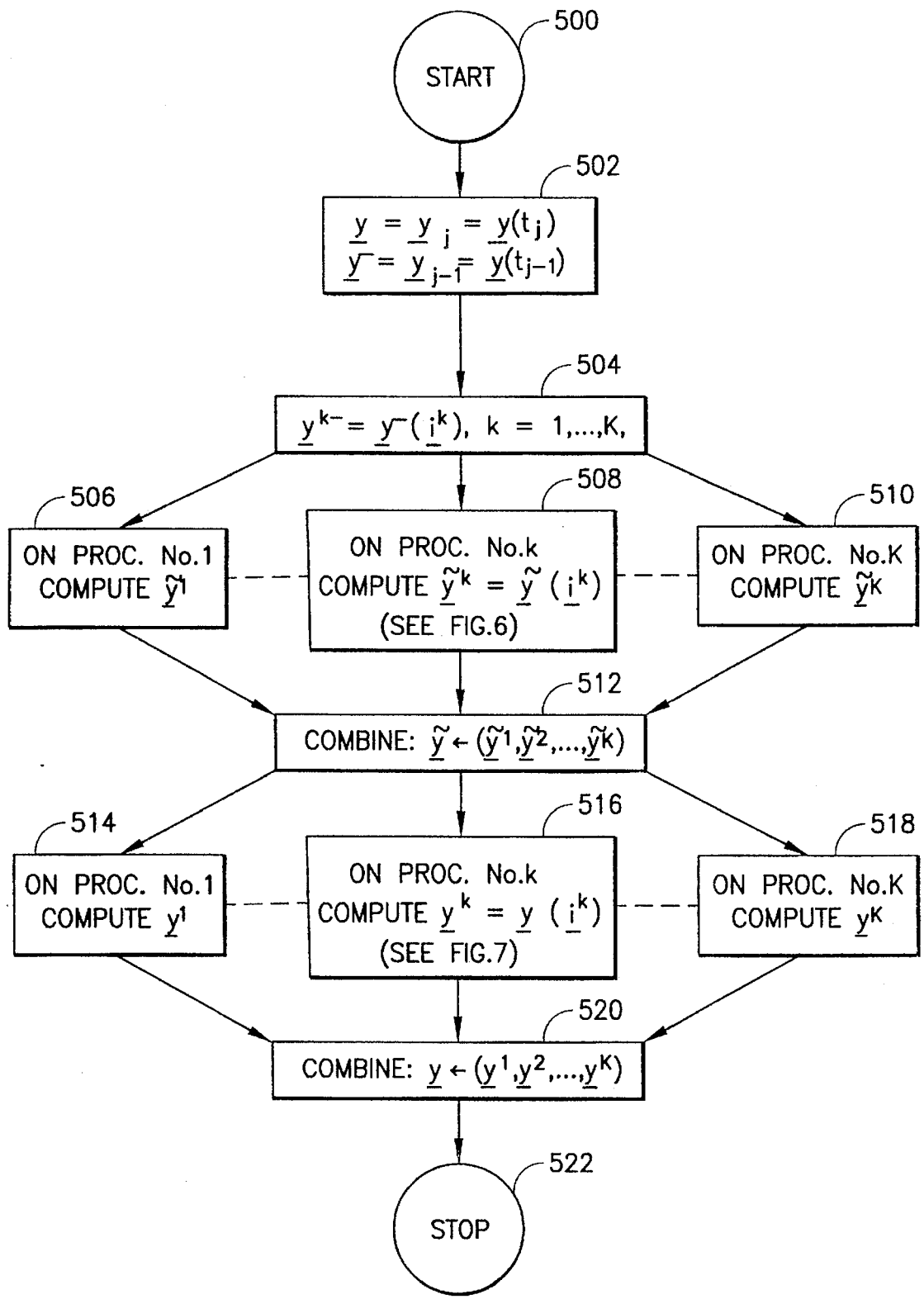
FIG. 5 depicts the logic of carrying out each time step in the parallel solution of the K uncoupled subsystems on different processors, each such step involving two passes over all subsystems.
Figure 6:
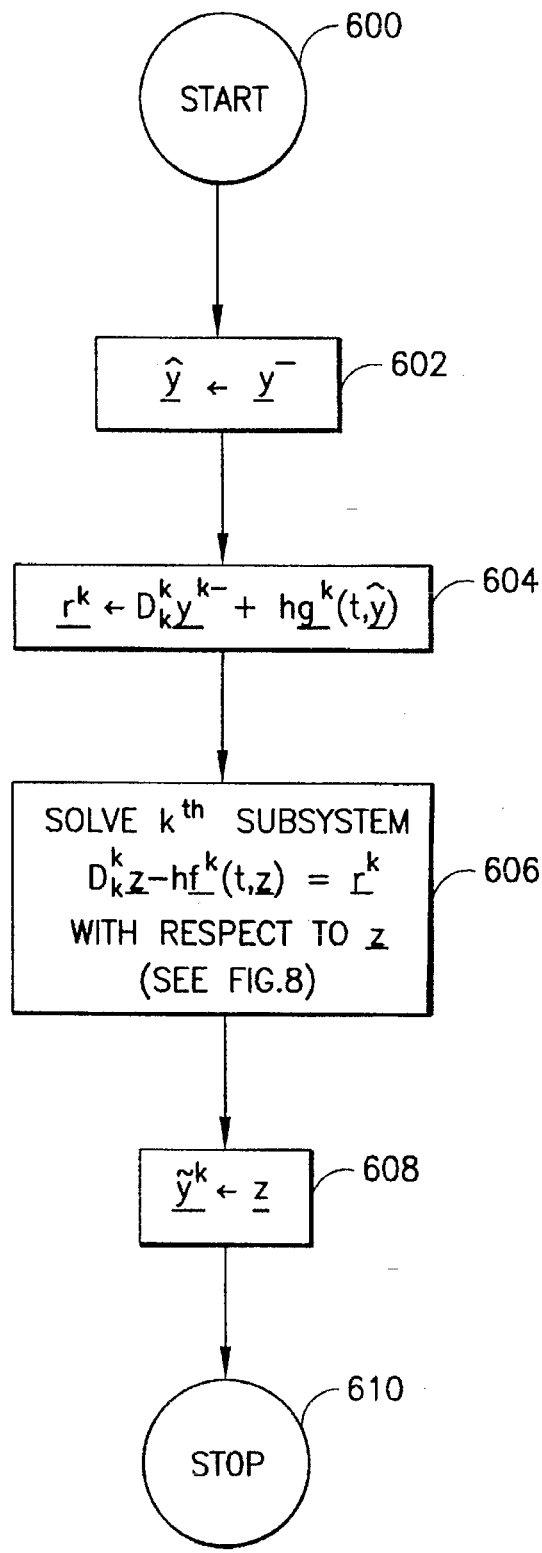
FIG. 6 defines the relations governing the first solution pass for the $k^{th}$ subsystem.
Figure 7:
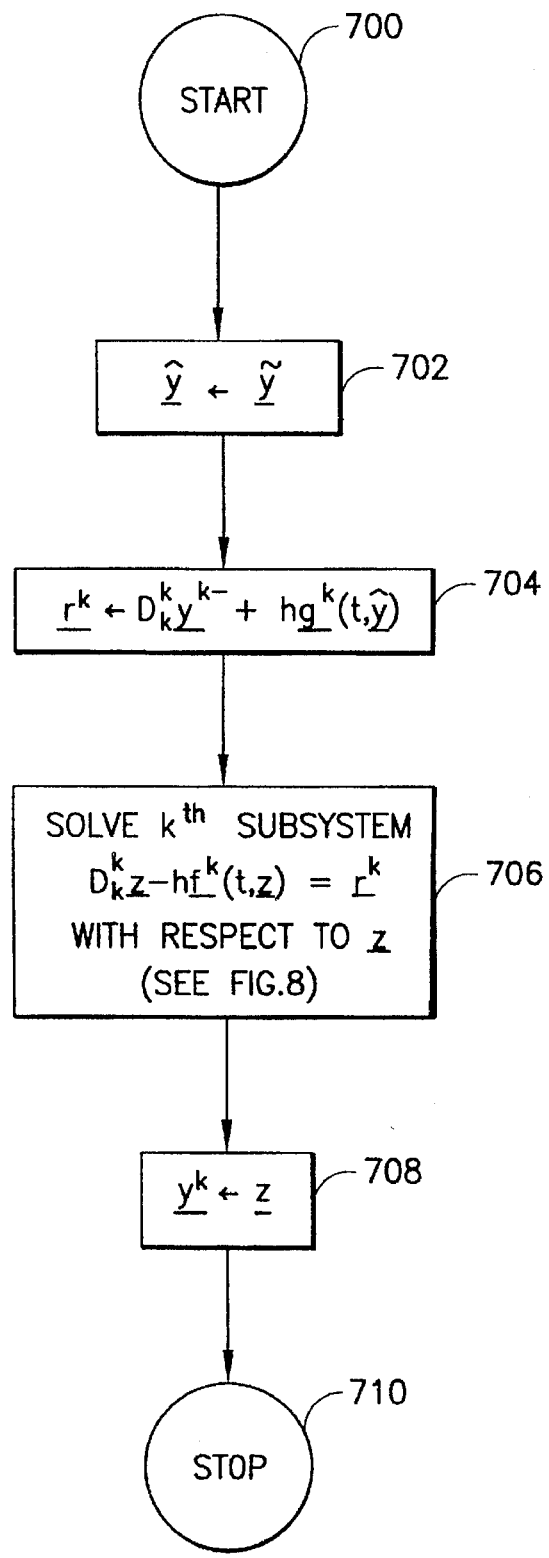
FIG. 7 states the relations governing the second solution pass for the $k^{th}$ subsystem.
Figure 8A:
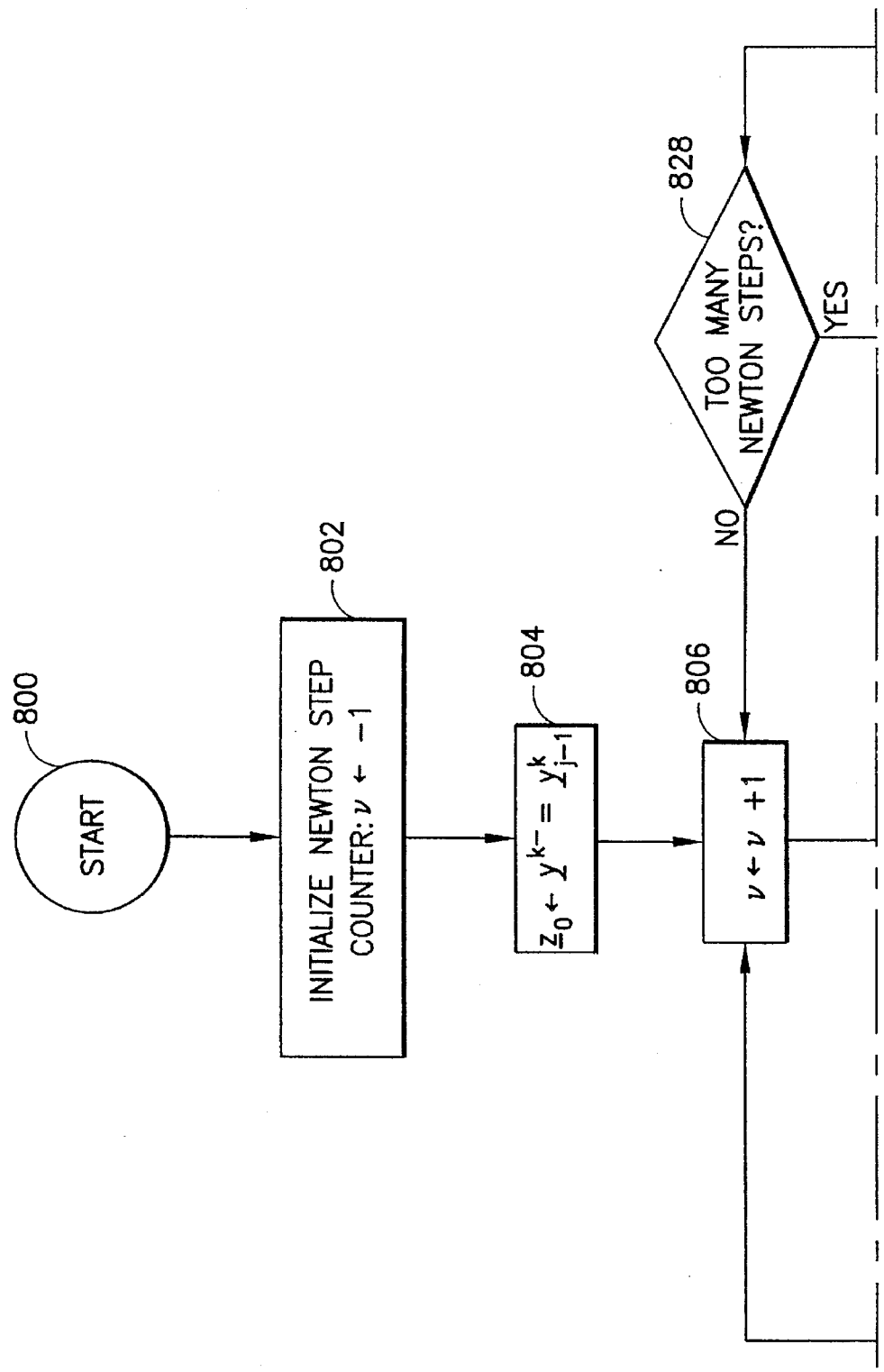
FIG. 8 shows the implementation of the Newton method for solving the $k^{th}$ algebraic subsystem, resulting from applying the BE method to the $k^{th}$ subsystem of differential equations, in case these subsystems are nonlinear.
Figure 8B:
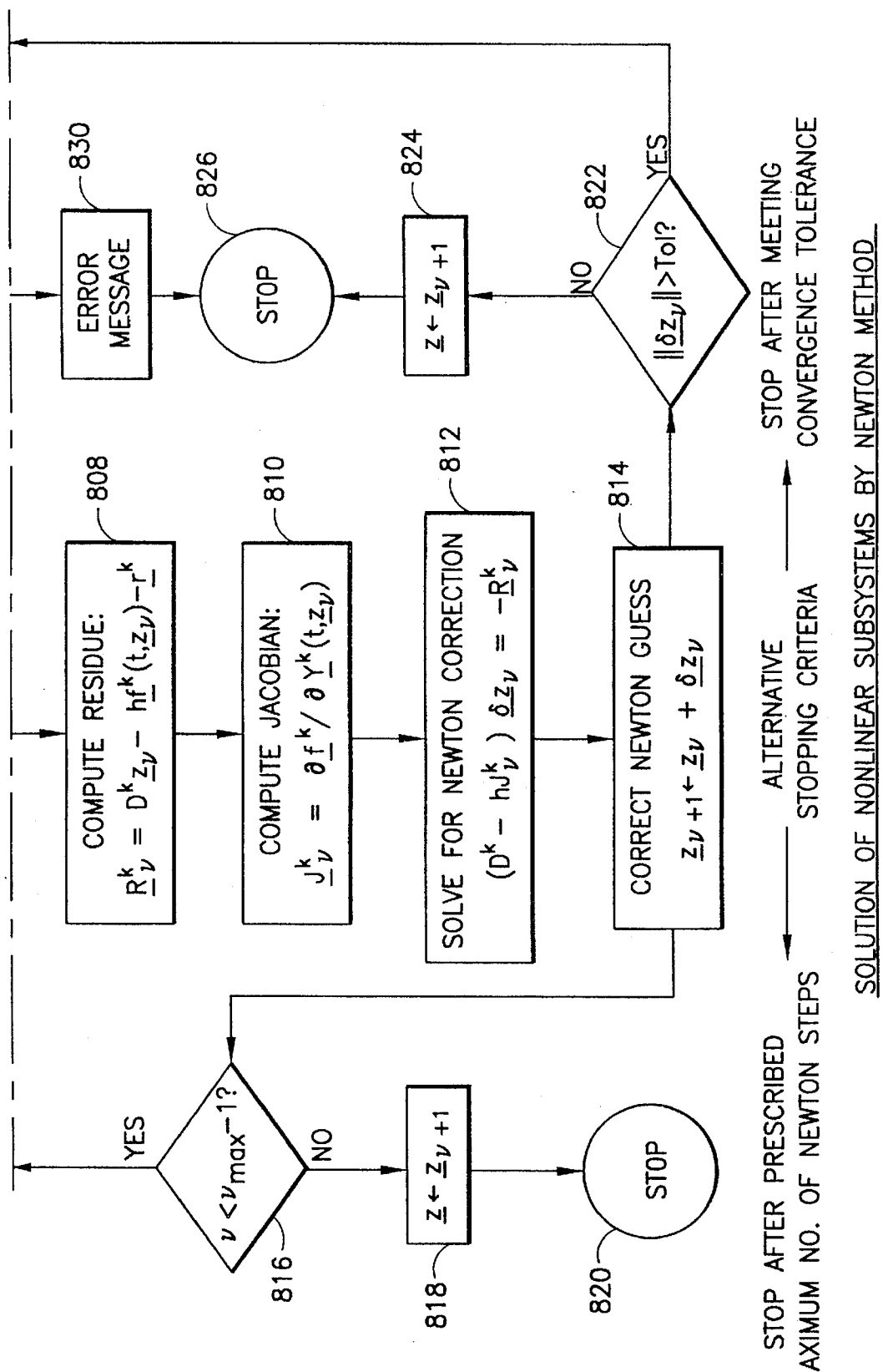

The precise details of the implementation of DSBE are shown in the flow charts of FIGS. 2–8. The referenced drawing figures in some of the blocks of the diagrams refer to subsequent flow charts, detailing the blocks in question. The flow chart of FIG. 5 explains the parallel updating scheme of DSBE. Its blocks referencing to FIGS. 6 and 7 are detailed in FIGS. 6 and 7, respectively. Finally, the blocks of FIGS. 6 and 7 which are referenced to FIG. 8 are executed by the Newton method explained by the flow chart of FIG. 8.

Figure 2:
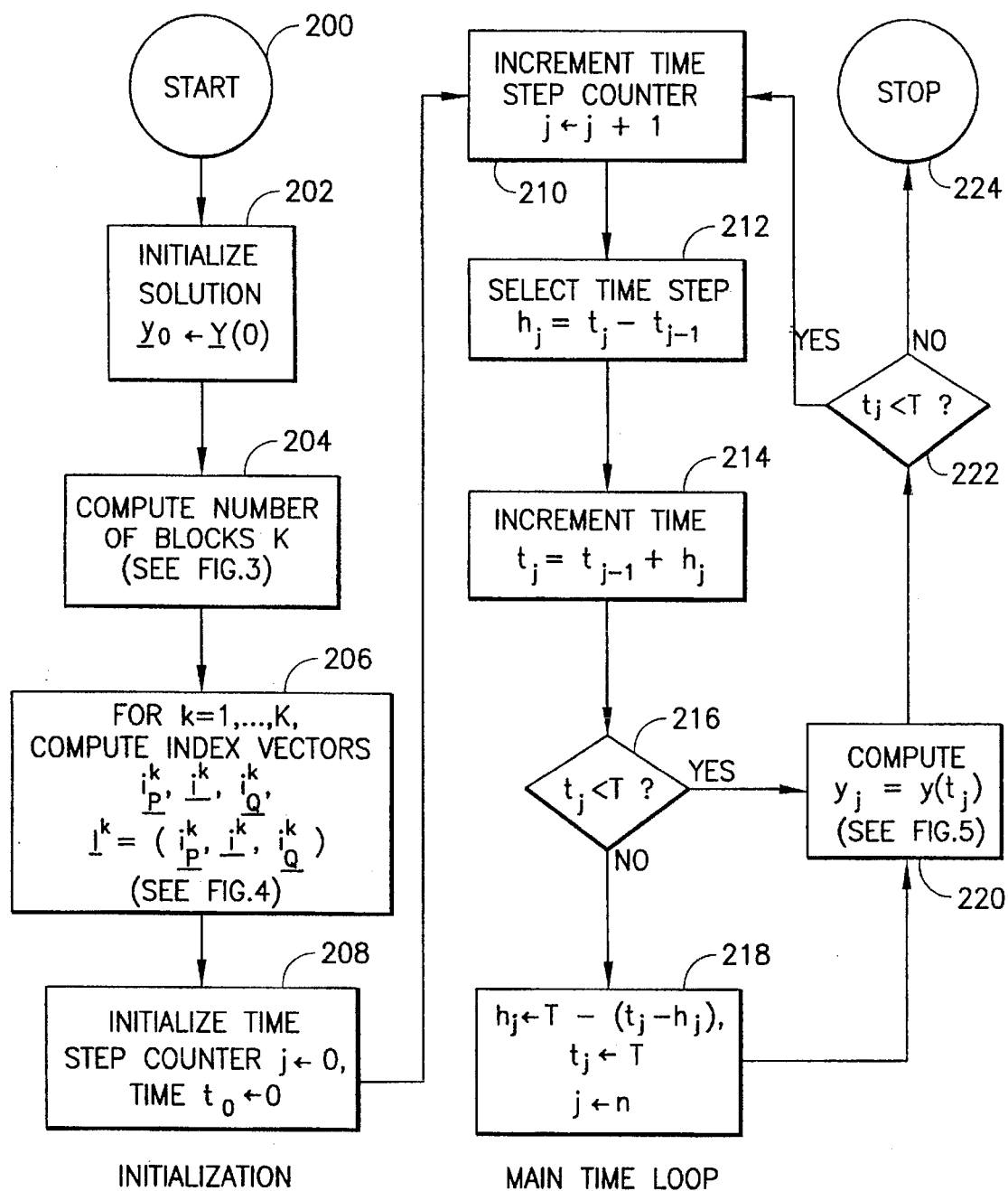
FIG. 2 is a flow chart of a calling routine, governing the overall time integration of the differential equations.

In FIG. 2, the overall logic of the time integration of the state variables by this invention is shown. Starting at 200, the procedure passe, s through four initialization steps, 202, 204, 206, and 208. In 202, the state variables are initialized. In 204, the number of blocks K for the block representation of the system is determined, as detailed in FIG. 3. In 206, for each block number k, the index vectors used in processing the information of the $k^{th}$ subset of differential equations on one of the available processors are produced as detailed in FIG. 4. For each subset, the associated index vectors identify the state variables which are active in the left, center, and right block of a block tridiagonal matrix representation of the subset of the system of differential equations in question. They make it possible to partially exploit the sparseness of the system, taking into consideration the fact that the system may be banded as explained in item 6 of the preceding subsection. Finally, in 208 the time and time step counters are initialized.

The blocks 210–224 give the logic of the sequential step-by-step integration of the unknown state variables over a total of n steps, whereby after n steps the end t=T of the interval of integration is reached. The time step index j is incremented in 210. Next, some time step selection procedure is assumed to have been chosen for picking the next time step $h_j$ in 212. This choice may be made by any one of many procedures proposed in the open literature and need not be described in detail. The time is then incremented to $t_j$ in 214. In 216, it is tested whether $t_j$ is less than T. IF the answer is "yes", then the numerical solution $y_j$ is computed by block 220, as detailed in FIG. 5. If, on the other hand, the answer is "no" (that is $t_j$ is larger than or equal to T) then the proposed choice of $h_j$ is rejected in block 218 in favor of a choice putting the next time point exactly at T and identifying j as the final count n, and then proceeding to 220 for computing the final solution vector $Y_j=Y_n$. In block 222, $t_j<T$ is tested again. fit was found to be true in the first test in block 216, then it is still true now upon reaching block 222 and the flow returns to block 210 to begin processing the next time step. If, on the other hand, it was found to be untrue in block 216 then $t_j$ was set to T in block 218. Thus, upon reaching 222, the answer to the second test is "no" and the integration procedure stops at 224.

Figure 3:
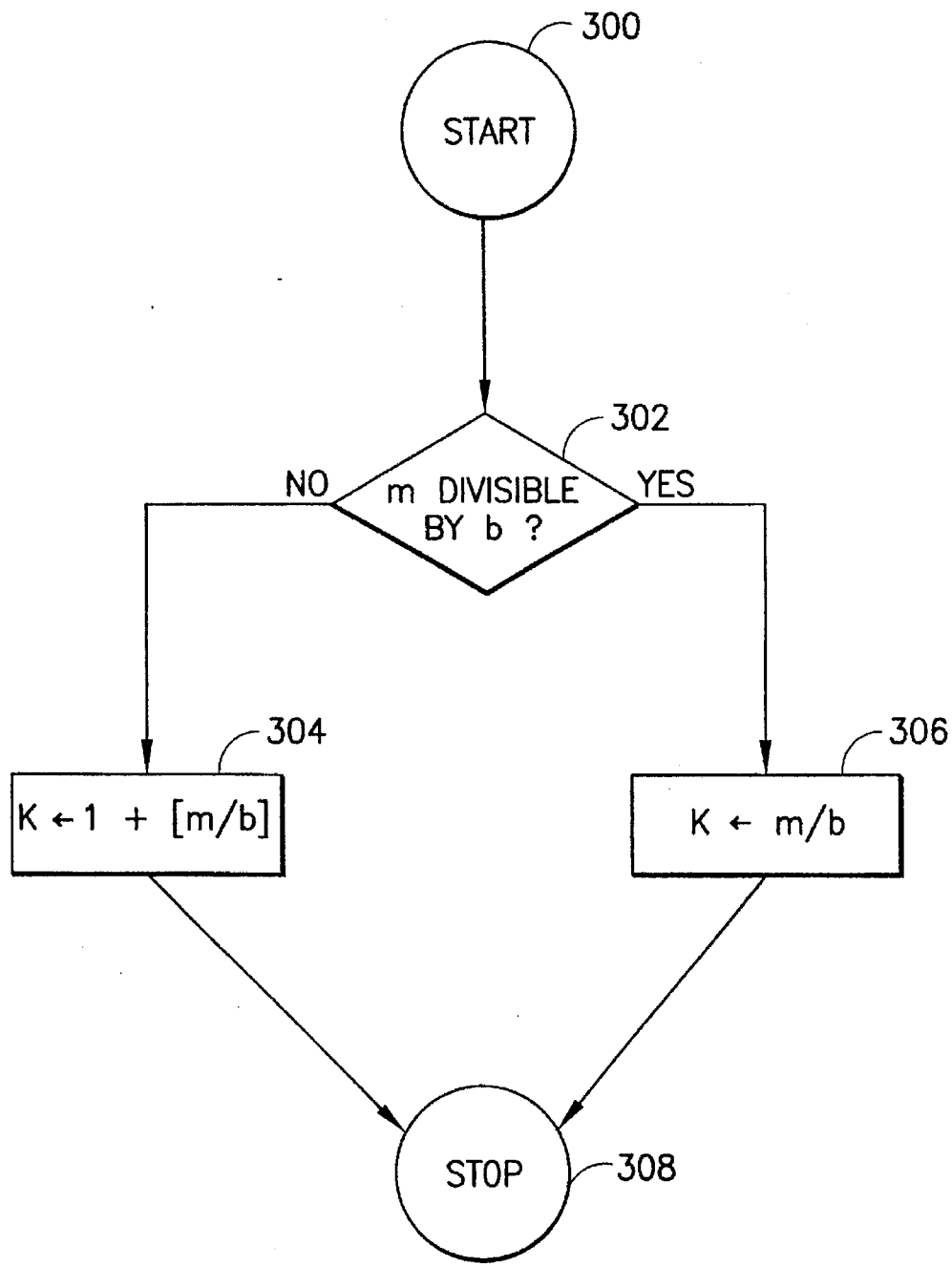
FIG. 3 gives the definition of the number K of subvectors into which the vector of all of the unknowns is subdivided.

FIG. 3 explains the determination of the number K of subvectors into which the vector of all of the state variables is subdivided For distributed processing. Starting at block 300, a decision is made at 302 whether or not the order m of the system is divisible by the block size b. If the answer is "no", then K is determined at 304 and the computation stops at 308. If, on the other hand, the answer is "yes", then K is computed as stated in 306 and again the flow terminates at 308.

FIG. 4 contains the rules for computing, recursively for k=1,..., K, the index vectors used in processing the K block rows of equations for a banded system with bandwidth parameter s, each block row consisting of a number of equations smaller than or equal to b. The processing starts at block 400. The block index k is initialized at 402 and incremented at 404. The center block index vector $i^k$ is computed according to 406. In blocks 408 and 410, the left and right block index vectors $i_P^k$ and $i_Q^k$ are determined, respectively. In 412, the left, center, and right block index vectors are catenated to form $I^k$. Then, at 414, it is checked whether k is smaller than K. If the answer is "yes", then the flow returns to 404 and the computation is carried out for the next larger value of k. IF the answer is "no", then the computation stops at 416.

Consider next the flow chart of FIG. 5. Here, the parallel processing of the K subsets of differential equations is explained, starting at 500. In block 502, simplifying notation is defined. In 504, for each k, the auxiliary variables $y^{k-}$ are retrieved From the data pertaining to the time level $t_{j-1}$. This information is then communicated to all K processors in use which, in blocks 506–510, carry out in parallel a first processing pass to determine preliminary values $\tilde{Y}^k$ for all of the subvectors $Y^k$, k=1,..., K, as detailed in FIG. 6. In 512, the resulting information is collected to form the full preliminary solution vector $\tilde{y}$. Thereafter it is rebroadcast to all K processors and is used in carrying out the second parallel processing pass via blocks 514–518. For each k, the resulting subvector $y^k$ respresents the final approximation to the exact solution at time $t_j$. This information is collected in block 520 to Form the final solution vector y, whereupon the time step updating procedure is completed and ends at 522.

The calculation of the preliminary update $\tilde{y}^k$ of the $k^{th}$ block of data is detailed in FIG. 6. Starting at 600, the input variable $\hat{y}$ is defined in 602, using $y^-$ defined in 502. In block 604, the auxiliary variable $r^k$ is computed, using $y^K$ defined in 504 and $\hat{y}$. Also in 604, the simplified notations $h=h_j$ and $t=t_j$ are used, and the $k^{th}$ diagonal block $D_k^k$ of the coefficient matrix D appearing in the statement of equation (7) of the system of differential equations to be solved, and the function $g^k$ defined by (10) are used in the computation. The subset of algebraic equations stated in block 606 is then solved, as detailed in FIG. 8, for an unknown solution vector generically called zwhich, in 608, is identified as $\tilde{y}^k$, whereupon the calculation stops at 610.

FIG. 7 is entirely analoguous to FIG. 6 but, whereas the result of executing the flow chart of FIG. 6 in the first solution pass of FIG. 5 results in the preliminary answer $\tilde{y}^k$, the execution of the flow chart of FIG. 7 in the second solution pass of FIG. 5 results in the final answer $z=y^k$. The difference lies in the definition of $\hat{y}$ in 702 which uses $\tilde{y}$, as opposed to 602 where $y^-$ is used. Note that the blocks 604 and 704 are identical and so are the blocks 606 and 706.

The last of the flow charts in FIG. 8 gives the logic of the solution by the Newton method of the subset of algebraic equations defined in block 606, resp. 706, in the case where the system of differential equations to be solved is nonlinear. This procedure is well-known in the open literature. It is given here only for the sake of completeness. In FIG. 8, two different criteria are shown by which it can be decided when the Newton iteration is to be stopped.

Figure 9:
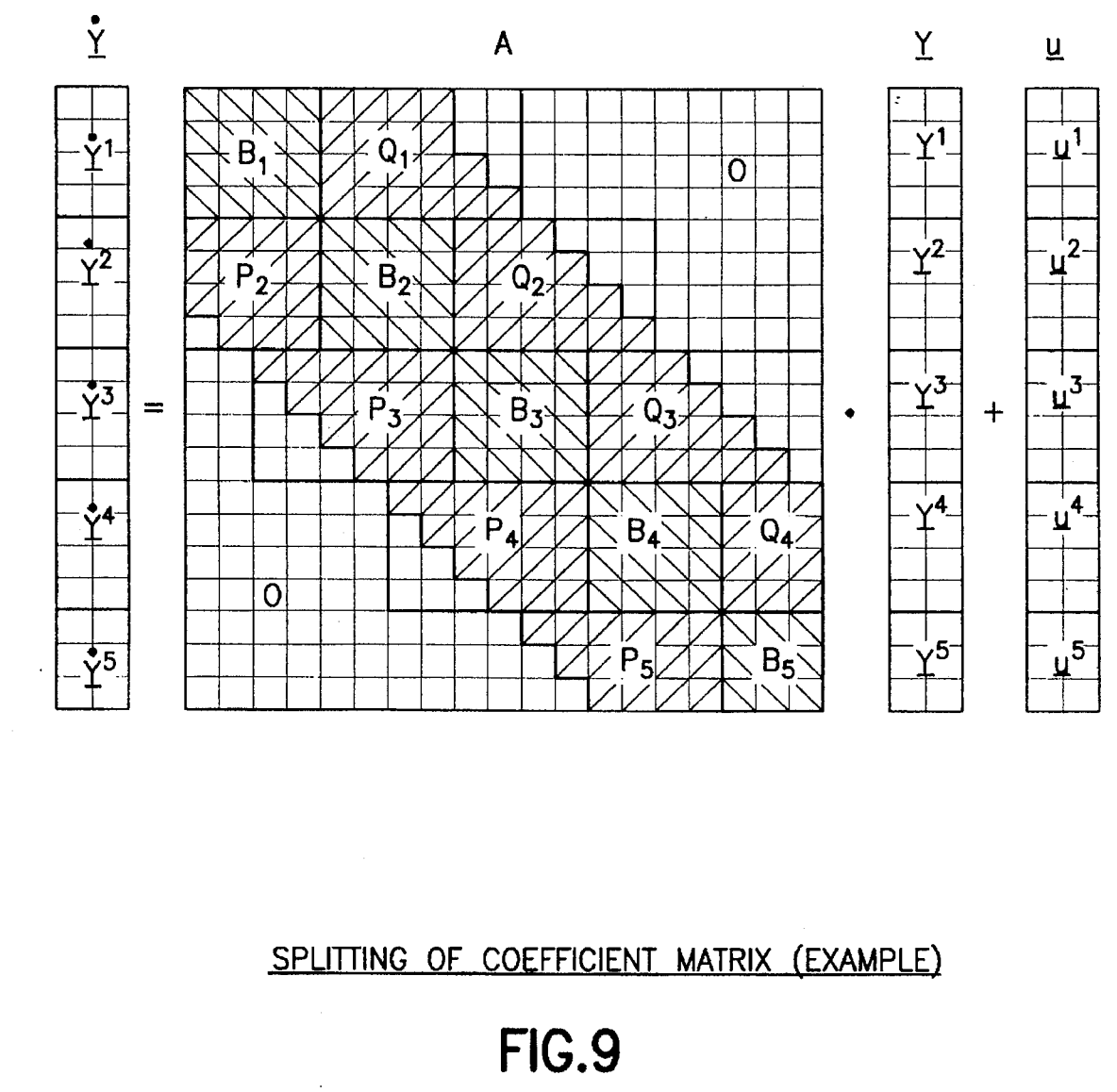

FIG. 9 shows a small example of the block structures of the banded coefficient matrix and of the data vectors, used in the distributed processing of a linear system of ordinary differential equations via the method claimed in this invention. It shows, in particular, the square diagonal blocks of the matrix and the rectangular off diagonal submatrices forming a block triangular representation of the banded system. The dimensions of the blocks and submatrices and their position within the Full coefficient matrix are defined by the index vectors computed according to the flow chart of FIG. 4 and are listed hereafter.

Numerical Example

To illustrate the procedure defined above we explicitly give the parameters, used in the implementation of DSBE, For the example of a banded linear problem shown in FIG. 9.

1. The number of equations and unknowns is m=19, the number of subvectors (blocks) of Y is K=5, and the bandwidth is 2s+1=13, where s=6 is the bandwidth parameter. The first Four subvectors are of length b=4 and the fifth is of length 3.

2. The blocks $A_g^k$ and $C_g^k$, k,q=1, ..., 4, are of dimension 4 by 4; $A_5^k$ and $C_5^k$, k=1, ..., 4, have four rows and three columns; $A_k^5$ and $C_k^5$, k=1, ..., 4, have three rows and four columns; finally, $A_5^5$ and $C_5^5$ are of dimension 3 by 3.

3. The block diagonal matrix D of equation (20) is the identity matrix. It is assumed that the standard splitting defined by (13) is used. For this splitting, for each k, $B_k^k = A_k^k$, $C_k^k = 0$, $I^k = (i_P^k, i_Q^k)$, and $C^k = (P^k, 0, Q^k)$.

4. The off-diagonal blocks of the block-tridiagonal matrix representation have the following dimensions: $Q_1$, $Q_2$, $Q_3$, $P_3$ and $P_4$ are of dimension 4×6; $P_2$ is 4×4; $Q_4$ is 4×3; and $P_5$ is 3×6.

5. Because A is banded, the unknowns in $Y^k$ are coupled only to $Y^{k+1}$, $Y^{k-1}$, and parts of $Y^{k+2}$ and $Y^{k-2}$. (If we had chosen s<b, then the coupling would only have been to the "nearest neighbors" $Y^{k+1}$ and $Y^{k-1}$).

6. The index vectors are

| k | $i_P^k$ | $i^k$ | $i_Q^k$ |
|---|---|---|---|
| 1 | empty | (1,2,3,4) | (5,6,7,8,9,10) |
| 2 | (1,2,3,4) | (5,6,7,8) | (9,10,11,12,13,14) |
| 3 | (3,4,5,6,7,8) | (9,10,11,12) | (13,14,15,16,17,18) |
| 4 | (7,8,9,10,11,12) | (13,14,15,16) | (17,18,19) |
| 5 | (11,12,13,14,15,16) | (17,18,19) | empty |

It is to be understood that the above described embodiments of the invention are illustrative ones, and that modifications thereof may occur to those skilled in the art. Accordingly, this invention is not to be regarded as limited to the embodiments disclosed wherein, but is to be limited only as defined by the appended claims.

What is claimed is:

1. A method of obtaining values of state variables of a physical system of interconnected components, individual ones of said components comprising electrical components or mechanical components or fluidic components or biological components, the state variables including current in the case of an electrical component and speed in the case of a mechanical component and fluidic flow rate in the case of a fluidic component and signal strength in the case of a biological component, wherein the physical system is describable by a coupled system of ordinary differential equations providing time-dependent values of the state variables of the respective components, the method employs a distributed network of computers or a parallel computer having a plurality of processors of which p is the number of processors, the method comprising steps of:

counting a number m of unknown state variables wherein m is the number of equations in the system of differential equations, said equations to be solved over an interval of time subdivided into a sequence of time steps;

representing said state variables for all of said components of said physical system by state vectors wherein components of the vectors correspond respectively to said state variables of said physical system, each vector consisting of m components;

slicing the state vectors into a number K of subvectors wherein K is greater than one, each of said subvectors having a number of components equal to or smaller than b, wherein K is equal to m/b for integral values of m/b or equal to one plus the integer part of the quotient m/b for nonintegral values of m/b, the slicing providing an array of subvectors;

splitting respective ones of the equations into respective first parts having first sets of unknown values of state variables and into respective second parts having second sets of unknown values of state variables;

estimating values of said second sets of unknown values of state variables and inserting estimates of said second sets of unknown values of state variables into said second parts of said equations, said estimates corresponding to a state of said physical system at a first instant of time of a predetermined one of said time steps;

updating the state vector concurrently over any one of said time steps by use of a plurality of said processors of said computer, wherein in any one of said time steps, there are obtained first computed values of said first sets of unknown values of state variables at a final instant of time of said one time step, said final instant of time being equal to the sum of said first instant plus the duration of said one time step; and performing a further updating of the state vector over said one time step, wherein there are obtained second values of said first sets of unknown values of state variables, but with said first computed values used as estimated values of said second sets of state variables in said second parts of the differential equations.

2. A method according to claim 1 further comprising a step, prior to said splitting step, of grouping the rows of the system of differential equations into block rows in accordance with the slicing of the state vectors.

3. A method according to claim 2 wherein said splitting step includes a step of presenting any given block row of equations as a sum of two portions, a first of said portions depending only on a subvector whose number is the same as the number of a corresponding block row of equations and a second one of said portions representing the rest of the block row of equations, said splitting step being accomplished by considering the state variables in the first portion as unknowns but letting the state variables of the second portion contain estimated values during the updating of a solution of any block row of equations over each individual one of said time steps.

4. A method according to claim 1 wherein, prior to said estimating steps, numerous ones of said equations are coupled, and wherein said splitting and said estimating steps are operative to convert said coupled system of differential equations to a set of subsystems of equations which are uncoupled from one another, and said updating step is accomplished by applying Backward Euler numerical integration to the uncoupled subsystems of equations.

5. A method according to claim 1, further comprising a step, prior to said splitting step, of grouping the rows of the system of differential equations into block rows in accordance with the slicing of the state vectors;

wherein said splitting step includes a step of presenting any given block row of equations as a sum of two portions, a first of said portions depending only on a subvector whose number is the same as the number of a corresponding block row of equations and a second portion representing the rest of the block row of equations, said splitting step being accomplished by considering the state variables in the first portion as unknowns but letting the state variables of the second portion contain estimated values during the updating of a solution of any block row of equations over each individual one of said time steps;

wherein, prior to said splitting and said estimating steps, numerous ones of said equations are coupled, and wherein said splitting and said estimating steps are operative to convert said coupled system of differential equations to a set of subsystems of equations which are uncoupled from one another, and said updating step is accomplished by applying Backward Euler numerical integration to the uncoupled subsystems of equations; and wherein said updating step includes a step of solving the subsystems of equations concurrently by said plurality of processors, the solving step providing for solving for a temporary first value of an unknown subvector on one of the processors at a present time point by using, as estimated values of the state variables in the second portion of the subsystem of equations, values of state variables which were determined in carrying out an updating in a time step immediately preceding a current one of the time steps.

6. A method according to claim 1 wherein said updating step includes a step of reassembling said array of subvectors into a full vector having components which serve as temporary values of updated state variables.

7. A method according to claim 1, wherein said step of performing the further updating of the subsystems concurrently by said plurality of processors provides for solving for second values of unknown subvectors on respective ones of the processors at a present time point by using, as estimated values of the state variables in the second portions of the subsystems of equations, said temporary first values of subvectors obtained during the first solving of the subsystems of equations.

8. A method according to claim 7, wherein said step of performing a further updating includes a step of reassembling said second values of unknown subvectors into a full state vector having components which represent final values of all of the updated state variables.

9. A method according to claim 1, further comprising a repeating of said splitting, estimating, updating, and performing steps at successive time steps, said repeating being continued until values have been obtained for all state variables and at all of said final instances of time of each time step of said sequence of time steps into which said interval of time is subdivided.

* * * * *